United States Patent [19]

Yamanobe et al.

[11] Patent Number: 5,680,229
[45] Date of Patent: Oct. 21, 1997

[54] PHOTOELECTRIC CONVERSION APPARATUS WITH BAND GAP VARIATION IN THE THICKNESS DIRECTION

[75] Inventors: Masato Yamanobe, Machida; Shinichi Takeda; Takayuki Ishii, both of Hiratsuka; Toshihiro Saika, Zama; Isao Kobayashi, Atsugi, all of Japan

[73] Assignee: Canon Kabushiki Kaisha, Tokyo, Japan

[21] Appl. No.: 157,442

[22] Filed: Nov. 26, 1993

Related U.S. Application Data

[63] Continuation of Ser. No. 857,949, Mar. 26, 1992, abandoned.

[30] Foreign Application Priority Data

Mar. 27, 1991 [JP] Japan ................... 3-085753
Jul. 25, 1991 [JP] Japan ................... 3-207173

[51] Int. Cl.$^6$ .................................................. H04N 1/04
[52] U.S. Cl. ........................ 358/482; 257/55; 257/63
[58] Field of Search ....................... 358/471, 482, 358/483, 494, 213.11; 257/53, 55, 59, 65, 443, 57, 63, 66; 348/298, 299, 311–316; H04N 1/04

[56] References Cited

U.S. PATENT DOCUMENTS

| | | | |
|---|---|---|---|
| 4,723,129 | 2/1988 | Endo et al. | 346/1.1 |
| 4,740,796 | 4/1988 | Endo et al. | 346/1.1 |
| 4,740,829 | 4/1988 | Nakaguri et al. | 257/65 |
| 4,788,445 | 11/1988 | Hatanaka et al. | 250/578 |
| 4,814,842 | 3/1989 | Nakagawa et al. | 257/65 |
| 4,851,302 | 7/1989 | Nakagawa et al. | 257/55 |
| 4,857,751 | 8/1989 | Hatanaka et al. | 250/578 |
| 4,916,326 | 4/1990 | Hatanaka et al. | 250/578.1 |
| 4,922,117 | 5/1990 | Saika et al. | 250/578.1 |
| 4,939,592 | 7/1990 | Saika et al. | 358/482 |
| 4,984,034 | 1/1991 | Yamazaki | 257/65 |
| 4,992,839 | 2/1991 | Shirai | |
| 5,017,988 | 5/1991 | Komiyama et al. | 257/443 |
| 5,019,887 | 5/1991 | Niwa et al. | |
| 5,073,828 | 12/1991 | Yamada et al. | 358/482 |
| 5,097,304 | 3/1992 | Itabashi et al. | 257/443 |
| 5,196,912 | 3/1993 | Matsumoto et al. | 257/66 |
| 5,231,297 | 7/1993 | Nakayama et al. | 257/66 |
| 5,270,567 | 12/1993 | Mori et al. | 257/66 |
| 5,288,658 | 2/1994 | Ishihara | 437/101 |
| 5,311,040 | 5/1994 | Hiramatsu et al. | 257/57 |
| 5,567,956 | 10/1996 | Yamanobe et al. | 257/55 |

FOREIGN PATENT DOCUMENTS 4-65120  3/1992  Japan.

*Primary Examiner*—Kim Vu
*Attorney, Agent, or Firm*—Fitzpatrick, Cella, Harper & Scinto

[57] ABSTRACT

There is disclosed a photoelectric conversion element having a photoelectric conversion portion, at least comprising an insulating layer, a photoconductive semiconductor layer provided in contact with said insulating layer, and made of a non-single crystal material containing hydrogen atoms with the base of silicon, first and second electrodes provided in contact with the photoconductive semiconductor layer, and a third electrode provided in contact with the insulating layer. The amount of hydrogen atoms contained in said photoconductive semiconductor layer is made nonuniform in a thickness direction of said layer so that an energy band gap width of said layer changes.

11 Claims, 10 Drawing Sheets

FIG. 8A
PRIOR ART
FIG. 8B
PRIOR ART
$\tau_{on}$ : ①
$\tau_{off}$ : ②
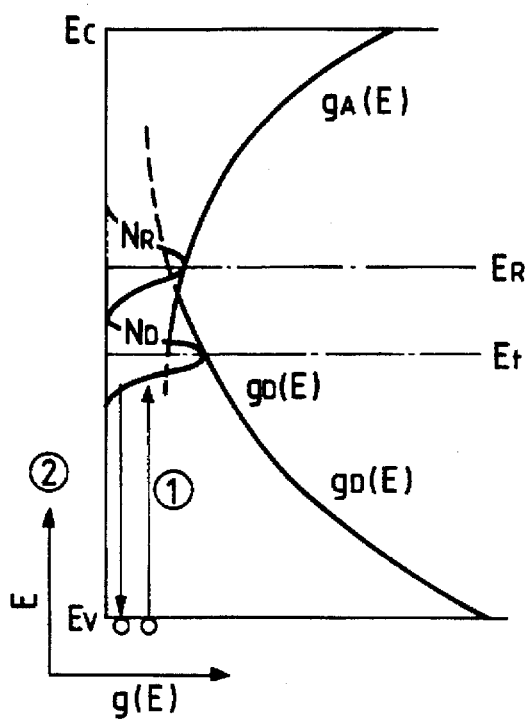
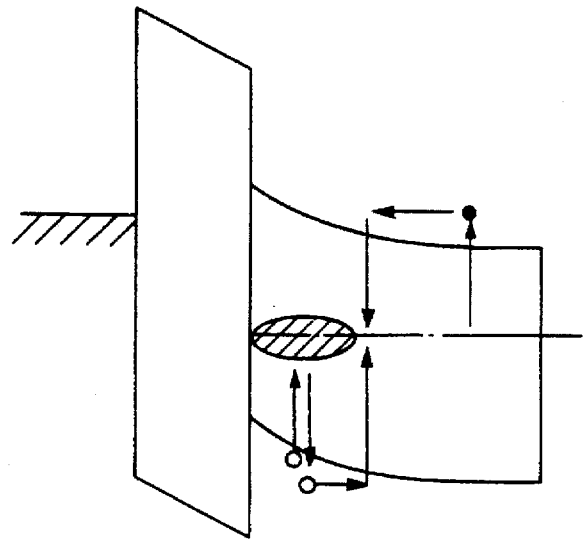
FIG. 9
PRIOR ART
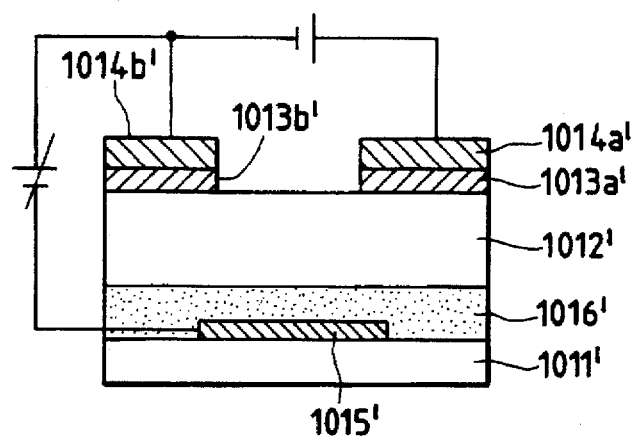

PHOTOELECTRIC CONVERSION APPARATUS WITH BAND GAP VARIATION IN THE THICKNESS DIRECTION

This application is a continuation of application Ser. No. 07/857,949 filed Mar. 26 1992, now abandoned.

BACKGROUND OF THE INVENTION

1. Field of the Invention

The present invention relates to a photoelectric conversion element, and more particularly to a photoelectric conversion element usable for an image processing apparatus such as a facsimile terminal equipment, a digital copying machine, or an image reader.

2. Related Background Art

Thin film semiconductors made of non-single crystal silicon (polysilicon, crystalline silicon and amorphous silicon) are suitably used for photoelectric conversion elements usable in larger or longer photoelectric conversion devices. The photoelectric conversion elements using thin film semiconductors are divided into two types of a primary photo current type (photodiode type) and a secondary photo current type. The primary photo current type is involved in a photoelectric conversion element in which the photoelectric conversion is made by picking up electrons and holes produced by the incident light, but has a problem that the photo current taken out as the output is small. On the other hand, a photoelectric conversion element of the secondary photo current type can produce a larger photo current (secondary photo current) than the photoelectric conversion element of the primary photo current type, and thus has many uses.

FIG. 1 is a schematic view illustrating the constitution of a photoelectric conversion element of the secondary photo current type. In FIG. 1, 1011 is an insulating substrate made of a glass, 1012 is a photoconductive semiconducting layer made of CdS.Se or amorphous silicon hydride (thereinafter abbreviated as "a—Si:H"), 1013a and 1013b are impurity layers for the ohmic contact, and 1014a and 1014b are electrodes. With such a constitution, if the voltage is applied across the electrodes 1014a, 1014b, a large secondary photo current flows when the light is incident from the side of the substrate 1011 or the electrodes 1014a, 1014b, so that the photoelectric conversion is made.

Further, photoelectric conversion elements of the thin film transistor type provided with auxiliary electrodes have been proposed for the stabilization and improvement of the characteristics (photo current or dark current). FIG. 2 is a schematic view illustrating the constitution of a photoelectric conversion element of the thin film transistor type provided with an auxiliary electrode. In FIGS. 1 and 2, like numerals refer to the like parts. 1015 is a transparent or opaque gate electrode, and 1016 is a gate insulating layer made of $SiN_x$ formed by the plasma CVD method, for example. Note that 1014a is a drain electrode, and 1014b is a source electrode, the voltages being applied to three electrodes 1014a, 1014b, 1015, respectively.

Examples of the gate voltage $V_G$ dependency of the photo current $I_p$ and the dark current $I_d$, and the linearity r ($I_p \propto F^r$) in the light quantity dependence, when the ray of light having the illuminance F is incident across the electrodes 1014a and 1014b of the photoelectric conversion element of the secondary photo current type, as shown in FIG. 2, are shown in FIGS. 3 and 4, respectively. Further, an example of the gate voltage $V_G$ dependency of the light response speed ($T_{ON}$: rise time, $T_{OFF}$: fall time) when the pulse light is incident is shown in FIG. 5.

The photoelectric conversion element of the thin film transistor type as shown in FIG. 1 is controlled for the stabilization of the characteristics so that an energy band gap of the photoconductive semiconductor layer may be substantially depleted. If the band gap of the photoconductive semiconductor layer is constant within the layer, electrons and holes produced within the photoconductive semiconductor layer are moved in opposite directions to each other owing to the slope of the band gap, with the irradiation of the light to the photoconductive semiconductor layer, whereby holes are collected in the vicinity of an interface between the photoconductive semiconductor layer and the insulating layer, and electrons are collected on a surface of the photoconductive semiconductor layer on the side of the first and second electrodes. Therefore, there is a problem that the photo current varies with the time as shown in FIG. 6, because it is subjected to the influence of traps due to interface defects and surface defects.

This point will be further described with reference to the drawings. In order to obtain a greater photo current, it is necessary that the gate voltage $V_G$ is a negative voltage as close to zero volt as possible. That is, it is necessary that the semiconductor layer 1012 is placed in a state depleted as weakly as possible so as not to cause the inversion of semiconductor. The reason will be described in the following.

This photoconductive type photo-sensor is operated in a state where a negative gate voltage ($V_G$) is applied. At this time, the band of the photoconductive semiconductor 1012 is normally depleted about 1 μm with a space charge distribution according to the Poisson's equation. That is, a portion of the photoconductive semiconductor layer 1012 on the side of the gate electrode 1015 is particularly strongly denser with the p-type. At this time, as a smaller voltage (larger absolute value) is applied to the gate electrode 1015, the linearity in the light quantity dependence is better, but the photo current decreases. This is believed due to the fact that as the photoconductive semiconductor layer 1012 is denser with the p-type, the lives of carriers (electrons in this case) are shorter, so that the gain G of the secondary photo current and thus the photo current decrease.

It should be noted that G is given by $$G = \mu \tau E / L$$

(μ: moving velocity of electron, τ: life of electron, E: electric field, L: electrode to electrode distance).

On the other hand, in order to increase the light response speed of the photoconductive type photo-sensor, it is necessary to have a smaller gate voltage (larger absolute value). This is believed due to the fact that there is a higher probability that the capture and emission of carriers are made in relatively shallow traps, as the gate voltage is smaller, so that the time constant of capture and emission is greater. In the following, this respect will be described in detail.

In an electron storage state, the light response speed is greatly influenced by the capture and emission process of electrons to a localized level, as shown in FIG. 7A. As shown in FIG. 7B, the rise time of output current is shorter with a larger $V_g$, because it is determined by the capture process to a shallow level $N_A$ which is a main capture level in the electron storage state. On the other hand, the fall time is dominated by the electron emission process from $N_A$ and the capture (recombination) process to a recombination center $N_o$ which is a deep level, but as the emission of electrons is very fast, it is believed to be the recombination process that is rate-determining. That is, since excess electrons exist in the recombination process in the electron storage state, the capture of holes to the recombination center is rate-determining, but as the recombination center of holes is farther away from the valence band with a smaller $V_g$ (larger absolute value), the rise time is slower with the smaller $V_g$.

On the other hand, in the hole storage state, the light response speed is greatly influenced by the capture and emission-process to a localized level, as shown in FIG. 8A. That is, since the rise time of output current is determined by the capture process to $N_o$ which is a capture level of holes, as shown in FIG. 8B, it is shorter with a smaller $V_g$. On the other hand, the fall time is determined by the emission process of holes from $N_o$ and the recobmination process at $N_A$, but since the emission of holes is much slower and thus rate-determining, it is faster with the smaller $V_g$.

FIG. 5 is a graph representation illustrating the relation of $T_{on}$ and $T_{off}$ to $V_g$. From the figure, the rise time $T_{on}$ has a maximum peak value near a certain value of $V_g$ (near a flat band voltage), in which in the negative electric field side thereof, the improvement (i) in the hole trap rate-determination is seen, while in the positive electric field side, the improvement (ii) in the electron rate-determination is seen. Also, the fall time $T_{off}$ increases monotonically with the increase of $V_g$, as shown in the figure, with the improvement in the hole trap rate-determination (i) and the recombination rate-determination (ii). That is, in order to improve the light response characteristics, it is requisite that the storage state of holes is intensified by having a smaller $V_g$ (larger absolute value), and the shallow capture level is used for the holes. At the same time, it is necessary that the recombination of holes is increased in its spacial region to reduce the emission amount of holes.

As above described, it was difficult to make excellent both the photo current and the light response speed in the photoconductive type photo-sensor.

SUMMARY OF THE INVENTION

The present invention is directed to solve the above-mentioned problems, and is aimed to provide a photoelectric conversion element having a large photo current in a secure stability of the photo current, and which is easily fabricated.

BRIEF DESCRIPTION OF THE DRAWINGS

FIGS. 8A and 8B are views for explaining the relation between the capture and emission process of holes to a localized level and the light response speed;

FIG. 9 is a typical cross-sectional view for explaining an example of photoelectric conversion element;

DETAILED DESCRIPTION OF THE PREFERRED EMBODIMENT

The above-described object can be accomplished by a photoelectric conversion element having a photoelectric conversion portion at least comprising an insulating layer, a photoconductive semiconductor layer provided in contact with the insulating layer, first and second electrodes provided in contact with the photoconductive semiconductor layer, and a third electrode provided in contact with the insulating layer, wherein the energy band gap width within a layer of the photoconductive semiconductor layer is varied from the energy band gap width of the photoconductive semicondctor layer on the side of the insulating layer and the energy band gap width of the photoconductive semiconductor layer on the side of the first and second electrodes.

Specifically, the variation of the energy band gap width can be accomplished by the photoelectric conversion element having the photoelectric conversion portion at least comprising the insulating layer, the photoconductive semiconductor layer provided in contact with the insulating layer, the first and second electrodes provided in contact with the photoconductive semiconductor layer, and the third electrode provided in contact with the insulating layer, wherein the energy band gap width of the photoconductive semiconductor layer is narrower on the side of the insulating layer, and wider on the side of the first and second electrodes, or wider on the sides of the insulating layer and the first second electrodes.

Figure 1:
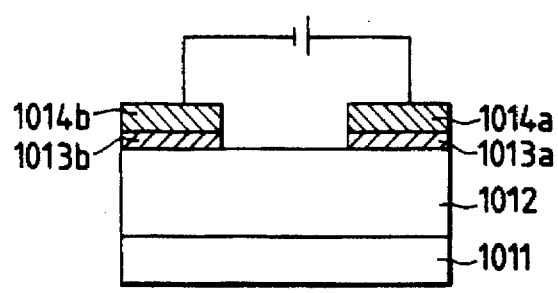
FIGS. 1 and 2 are typical constitutional views for explaining photoelectric conversion elements, respectively.
Figure 2:
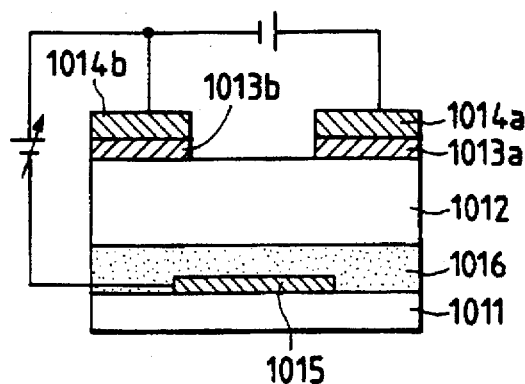
Figure 3:
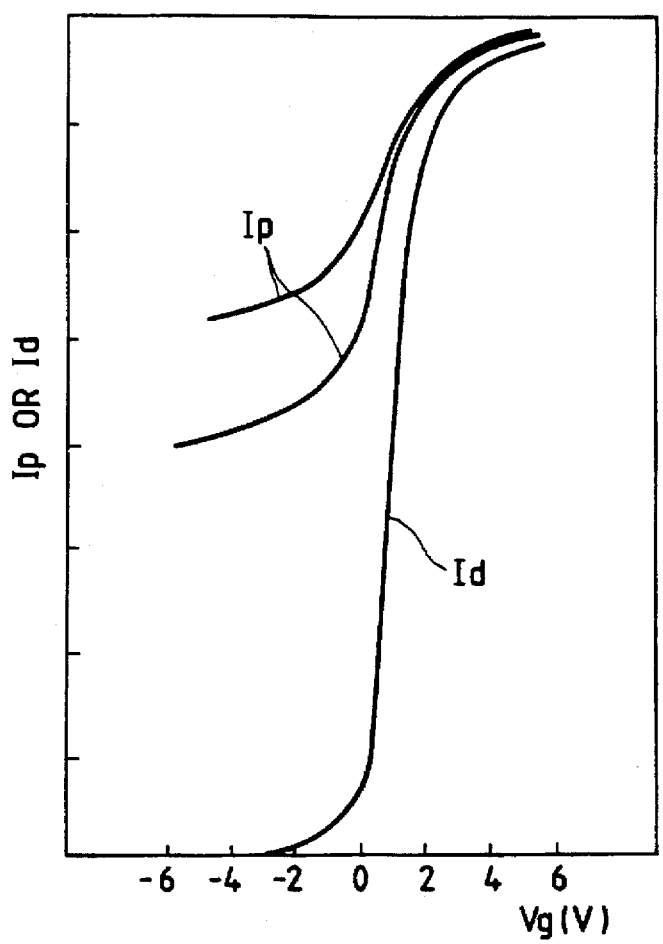
FIGS. 3 to 6 are views for explaining the characteristics of photoelectric conversion elements, respectively.
Figure 4:
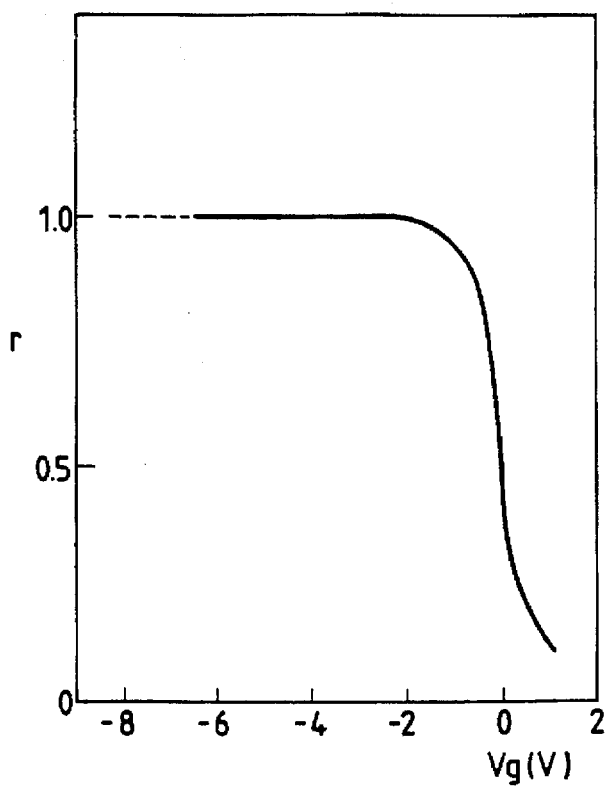
Figure 5:
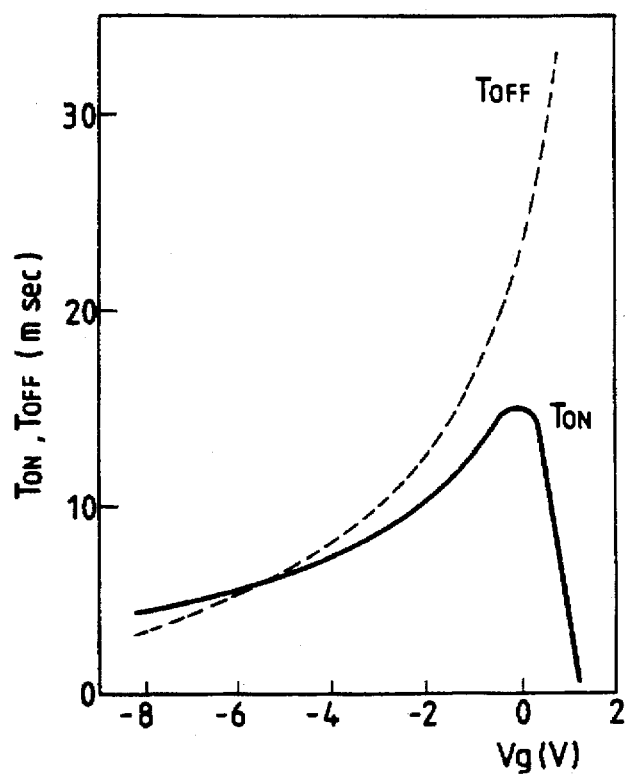
Figure 6:
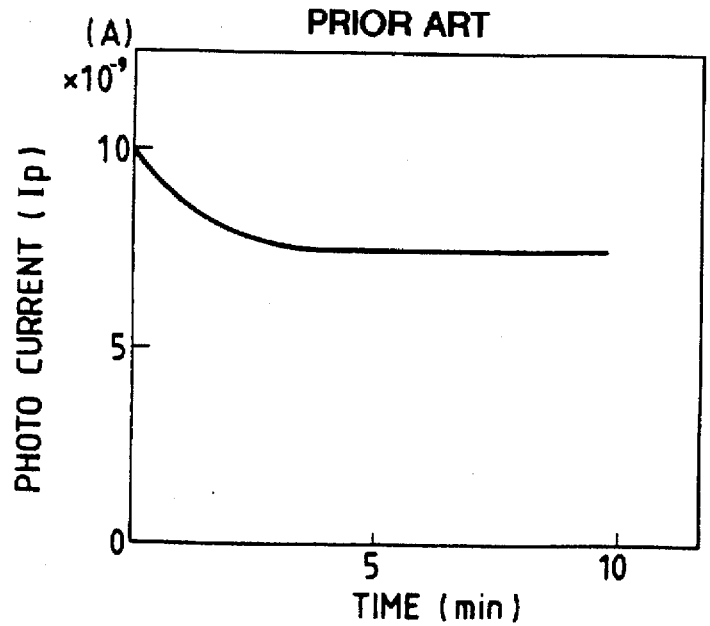
Figure 7A:
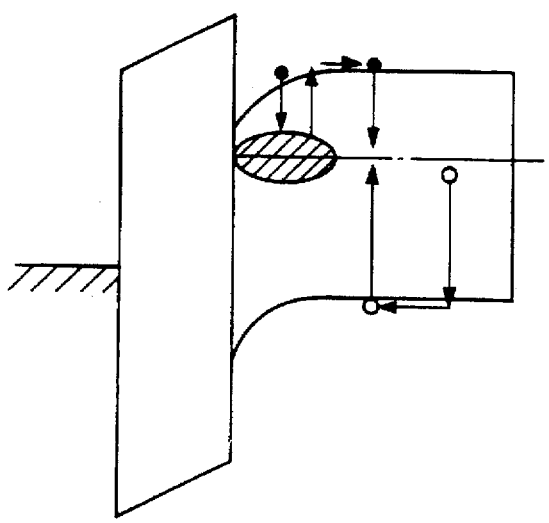
FIGS. 7A and 7B are views for explaining the relation between the capture and emission process of electrons to a localized level and the light response speed.
Figure 7B:
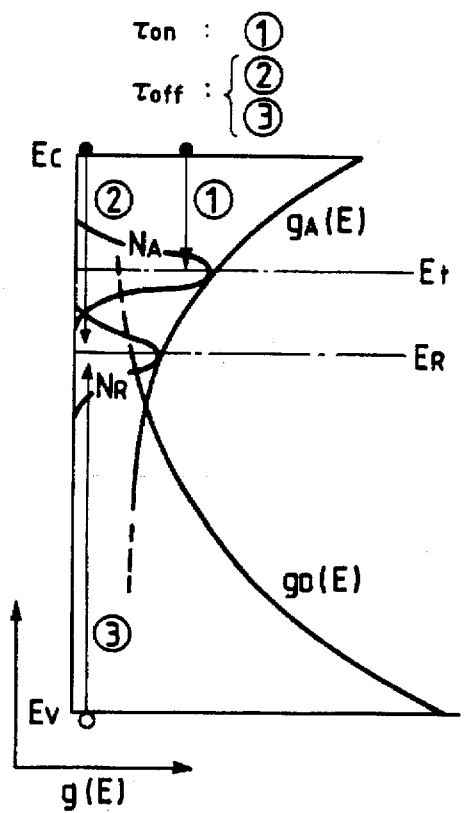

Referring to FIG. 1, the improvement of the characteristics (photo current magnitude and light response speed) for such a photoelectric conversion element of the secondary photo current type can be accomplished in such a manner that the energy band gap width of the photoconductive semiconductor layer 1012 is narrower from the side of the insulating layer 1016 (electrode 1015) toward the side of the ohmic contact layers 1013a, 1013b (electrodes 1014a, 1014b).

In the present invention, the photoconductive semiconductor layer may be a non-single crystal at least composed of silicon and hydrogen. And it is possible to form the photoconductive semiconductor layer with the band gap width varied at least by repeating alternately a process of depositing the non-single crystal layer and a process of irradiating the hydrogen plasma onto the non-single crystal layer.

In the photoelectric conversion element of the thin film transistor type, in order that the band gap width of the photoconductive semiconductor layer 1012 may be made smaller from the side of the electrode 1015 toward the side of the ohmic contact layers 1013a, 1013b, the composition of a—Si:H may be modulated with Ge having a narrower band gap width to form a—SiGe$_x$:H, so that the band gap width changes from 1.7 eV to 1.5 eV. However, the alloy of a—SiGe$_x$:H is likely to cause defects such as dangling bond, so that it is often difficult to make a great improvement of the characteristics and the easy fabrication for the photoelectric conversion element of the secondary photo current type. And a germane gas can be used as the Ge supply gas, but this gas in expensive, and may not possibly meet the requirement of a lower cost.

Therefore, the present invention provides a photoelectric conversion element capable of accomplishing the above object by changing the amount of hydrogen in a—Si:H.

In the present invention, by making different the band gap width with a layer of the photoconductive semiconductor layer from the band gap width of the photoconductive semiconductor layer on the side of the insulating layer and the band gap width of the photoconductive semiconductor layer on the side of the first and second electrodes, electrons and holes produced within the layer of the photoconductive semiconductor layer with the irradiation of the light are suppressed from moving to the surface of the photoconductive semiconductor layer on the side of the first and second electrodes, and the vicinity of the interface between the photoconductive semiconductor layer and the insulating layer, to decrease the influence of traps due to interface defects and surface defects, so that it is possible to embody the photoelectric conversion element having a large photo current in a secure stability of the photo current.

Also, it is possible to provide a photoelectric conversion element which is cheaper, easily fabricated, and has a high stability of the photo current by changing the band gap width with the hydrogen content.

Note that the hydrogen content contained in the photoconductive semiconductor layer may be different depending on the desired characteristics, but is preferably 30 atomic % or less, more preferably 20 atomic % or less, and most preferably 15 atomic % or less. From the point of the compensation of dangling bond, the hydrogen content contained is preferably 0.01 atomic % or greater, more preferably 0.1 atomic % or greater, and most preferably 1 atomic % or greater.

The present invention seeks to resolve the above mentioned problems by reducing the use amount of expensive germane gas (GeH$_4$) extremely.

In this case, the a—SiGe:H layer is sandwiched between a—Si:H layers. Thereby, the region of a narrower band gap width is formed within the photoconductive semiconductor layer, and carriers are suppressed from moving to the interface and the surface of the photoconductive semiconductor layer to the insulating layer, so that it is possible to provide a photoelectric conversion element capable of obtaining a large photo current stably.

The examples of the present invention will be described in detail with reference to the drawings.

(EXAMPLE 1)

FIG. 9 is a schematic constitutional view of a photoelectric conversion element according to the present invention. In the same figure, 1011' is a substrate, 1016' is an insulating layer, 1015' is a third electrode (gate electrode), 1014a' is a first electrode (drain electrode), 1014b' is a second electrode (source electrode), 1013a', 1013b' are ohmic contact layers, respectively, and 1012' is a photoconductive semiconductor layer.

Figure 10:
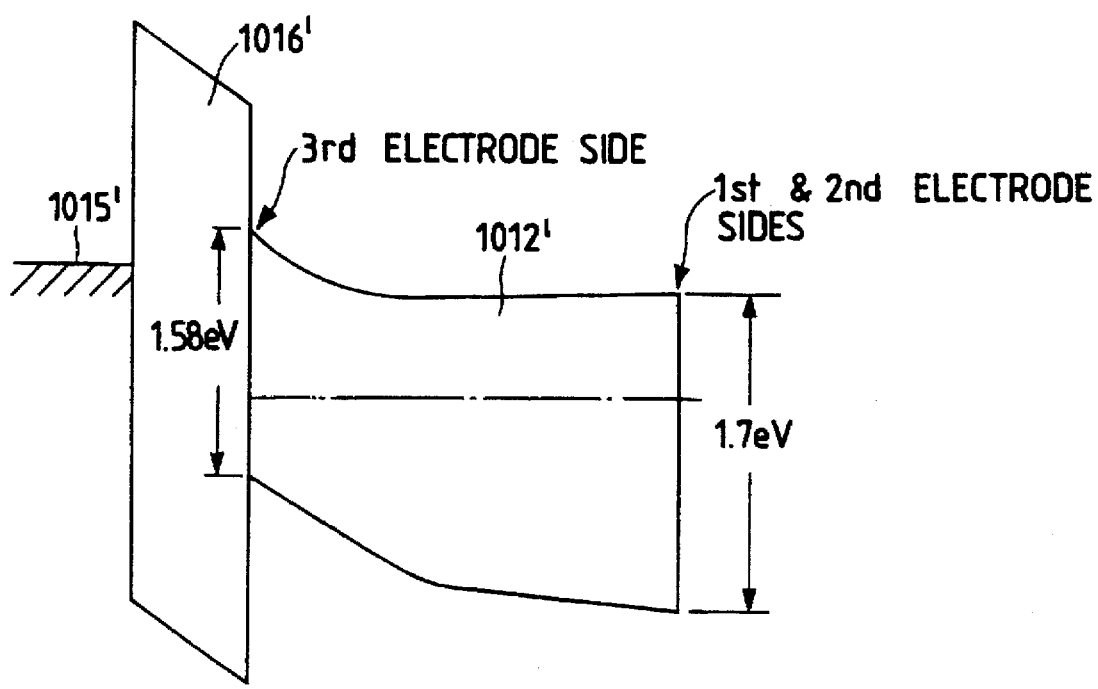
FIGS. 10 and 18 are energy band diagrams for explaining examples of the energy band in the photoconductive semiconductor layer of photoelectric conversion element, respectively.

FIG. 10 is an energy band diagram of the photoconductive semiconductor layer for the photoelectric conversion element in this example. The photoconductive semiconductor layer 1012' is such that the band gap width (optical band gap) is narrower on the side of the third electrode (gate electrode) 1015' and the gate insulating layer 1016', and the band gap width is wider on the side of the first electrode (drain electrode) 1014 and the second electrode (source electrode).

Figure 11:
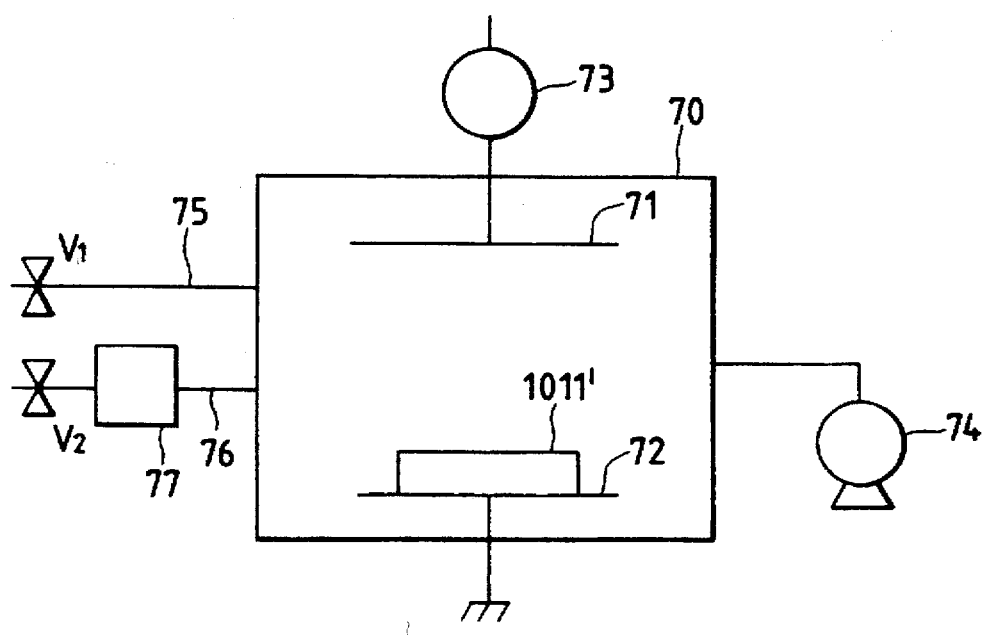
FIG. 11 is a conceptual view of a plasma CVD apparatus used for the fabrication of photoelectric conversion element.

FIG. 11 is a conceptual diagram of a plasma CVD apparatus for use in the fabrication of the photoelectric conversion element of the present invention. In FIG. 9, 70 is a reaction chamber, 1011' is a substrate on which functional layers such as a photoconductive semiconductor layer are formed, 71 is an anode electrode having a heater not shown, 72 is a cathode electrode, 73 is a high frequency power source of 13.56 MHz, 74 is an exhaust pump, 75 is an SiH$_4$ gas inlet conduit, 76 is an H$_2$ gas (containing Ar gas) inlet conduit, 77 is a microwave source of 2.45 GHz and a microwave applicator, and V$_1$, V$_2$ are valves for controlling the SiH$_4$ gas and the H$_2$ gas, respectively, which connect to a computer for precisely controlling the opening or closing time.

The photoelectric conversion element of this example can be fabricated in the following manner.

(1) A Cr layer having a film thickness of 0.1 μm was deposited on the glass substrate 1011' (#7059 manufactured by Corning) with the sputtering method and patterned with a predetermined pattern to form the gate electrode 1015'.

(2) This substrate 1011' was set on a normal plasma CVD apparatus, with the temperature set at 350° C., and then SiH$_4$ gas, NH$_3$ gas, H$_2$ gas were introduced at a predetermined mixture ratio, to deposit SiN$_x$:H, and form the insulating layer 1016' having a film thickness of 3000 Å.

(3) Next, the photoconductive semiconductor layer 1012' was deposited in the following procedure, for example, using the plasma CVD apparatus as shown in FIG. 9.

① First, the substrate 1011' was set, and then the chamber 70 was exhausted to a predetermined pressure with the exhaust pump 74, while it was heated up to 340° C. with the heater not shown.

Figure 12:
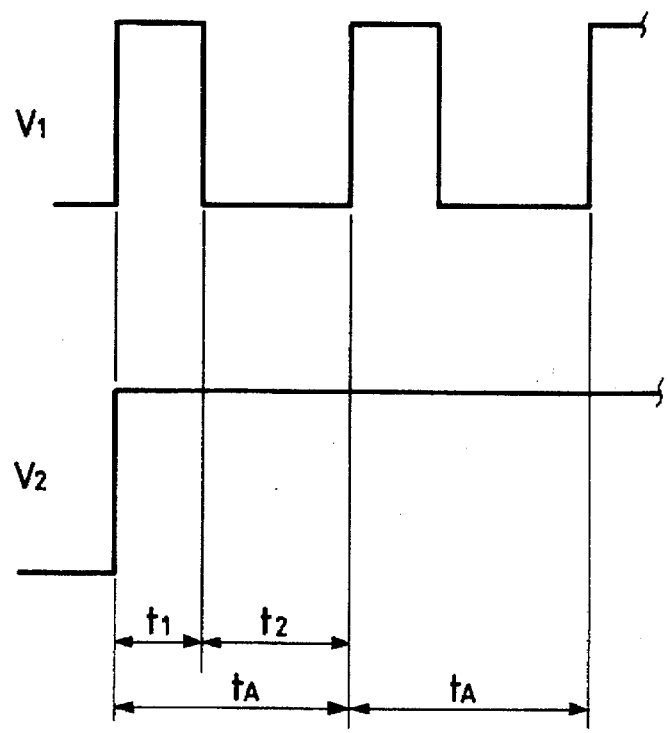
FIG. 12 is a view showing the gas introducing timing in the plasma CVD apparatus used for the fabrication of the photoelectric conversion element.
Figure 13:
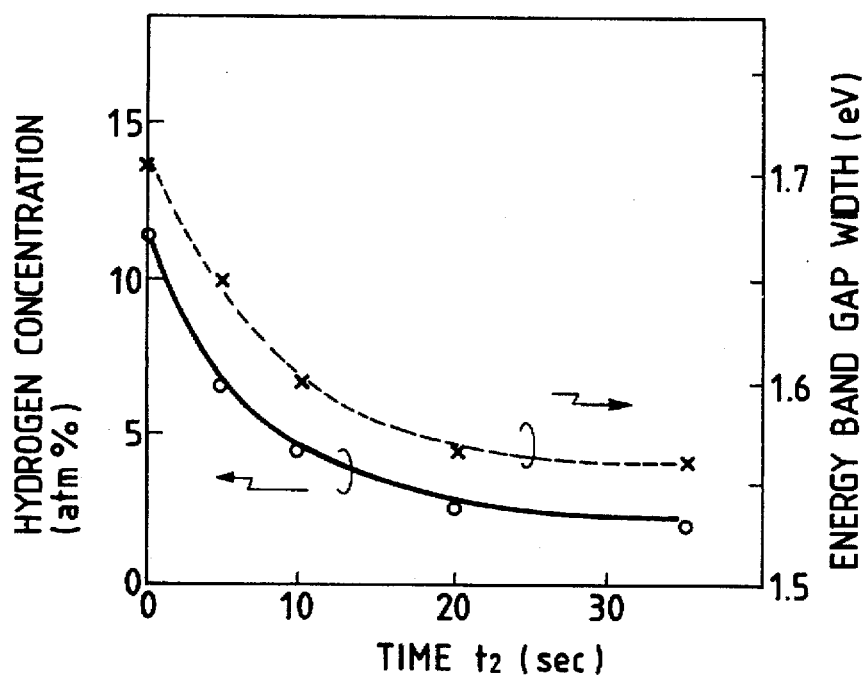
FIG. 13 is a graph representation of the hydrogen conventration and an energy band gap width for the photoconductive semiconductor layer of photoelectric conversion element.

② Next, the timings of introducing SiH$_4$ gas and H$_2$ gas were controlled as shown in FIG. 12, that is, in one unit (time t$_A$) of repetition consisting of the time t$_1$ for depositing the film and the time t$_2$ for irradiating the H$_2$ plasma. For the time t$_1$ of depositing the film, the valves V$_1$ and V$_2$ were both opened, so that SiH$_4$ gas, Ar gas and H$_2$ gas were introduced into the reaction chamber. With SiH$_4$ gas of 10SCCM and H$_2$ gas of 10SCCM, the internal pressure within the reaction chamber was adjusted to be 0.1 Torr with Ar gas. At this time, the deposition rate was about 3 Å/sec. Also, the film thickness to be deposited for the time t$_1$ was from 10 to 50 Å. For the H$_2$ plasma irradiation time t$_2$, the H$_2$ plasma was irradiated with the valve V$_1$ in a closed state, and the valve V$_2$ in an open state. Dependent upon the H$_2$ plasma irradiation time t$_2$, the film quality of the film deposited for the time t$_1$ was varied, particularly, the content of H was changed, whereupon as the time t$_2$ was longer, the band gap width (optical band gap) was changed from 1.7 eV to 1.58 eV. FIG. 13 shows an example of the time t$_2$ dependency of the hydrogen content and the band gap width (optical band width). As above described, it has been found that the band gap width (optical band gap) of the photoconductive semiconductor layer 12 could be easily controlled by the time t$_2$. In this example, the photoconductive semiconductor layer 1012' having a film thickness of 6000 Å was formed by varying the band gap width (optical band gap) from 1.7 eV to 1.58 eV, while gradually increasing the time $t_2$ from the side of the insulating layer 1016' toward the side of the first and second electrodes 1014a', 1014b', with the progress of the deposition.

(4) This substrate was set on the normal plasma CVD apparatus, and an ohmic contact layer having a film thickness of 1500 Å was formed using $SiH_4$ gas, $PH_3$ gas and $H_2$ gas.

(5) Finally, an Al layer having a film thickness of 8000 Å was formed with the sputtering method, and patterned along with the ohmic contact layer as above mentioned, so as to form the ohmic contact layers 1013a', 1013b', the drain electrode 1014a' and the source electrode 1014b.

With the photoelectric conversion element of the thin film transistor type as fabricated in the above manner, the photo current and the light response speed were measured. As a result, the photo current could be made equivalent to a voltage $V_G$ 0V of the a—Si:H simple layer when the voltage $V_G$ of the gate electrode 1015' was about −5V, and the light response speeds $T_{ON}$, $T_{OFF}$ could be greatly improved as indicated in Table 1, as compared with a comparative example of the fabrication over the entire photoconductive semiconductor layer 1012' under fixed conditions without the $H_2$ plasma irradiation.

TABLE 1

| | $T_{ON}/T_{OFF}$ |
|---|---|
| Comparative example | 20 msec/30 msec |
| Example 1 | 4 msec/4 msec |

Where $T_{ON}$ is a time for which the photo current reaches 90% the saturated value, and $T_{OFF}$ is a time for which the photo current reaches 10% the saturated value.

(EXAMPLE 2)

Figure 14:
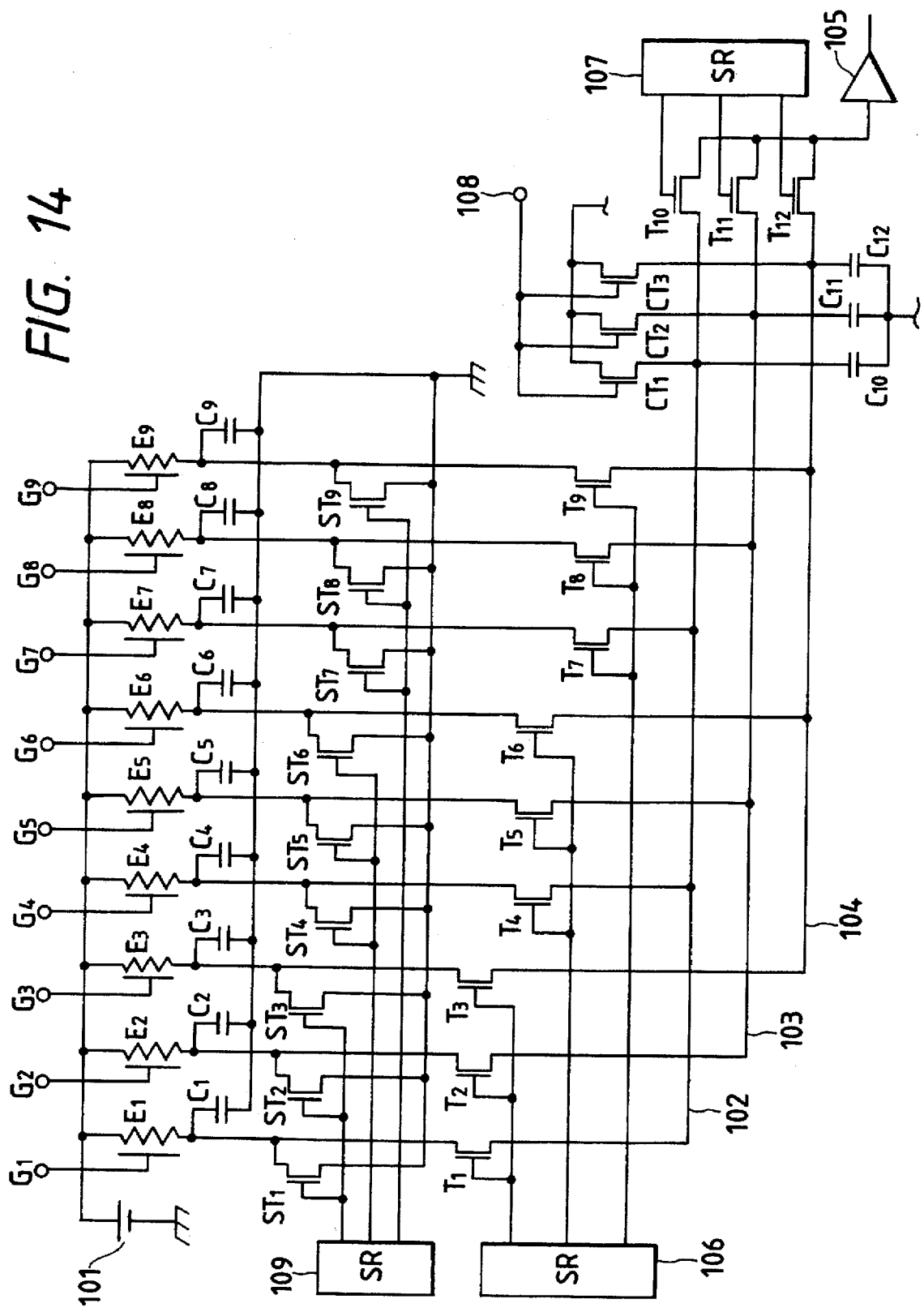
FIG. 14 is a circuit diagram of the photoelectric conversion element.

Using the photoelectric conversion element of the thin film transistor type and the thin film transistor as obtained in example 1, a photo-sensor of the one-dimensional complete contact type (photoelectric conversion element) was fabricated. FIG. 14 shows a circuit thereof. Note that a sensor array having nine photoelectric conversion units of the thin film transistor type is shown herein. In the same figure, the photoelectric conversion units E1 to E9 of the thin film transistor type constitute the sensor array with three blocks, each block being made up by three units. Capacitors C1 to C9 and switching transistors T1 to T9 are connected correspondingly to the photoelectric conversion units E1 to E9 of the thin film transistor type. Also, separate electrodes of the photoelectric conversion units E1 to E9 are connected to one of common lines 102 to 104 via respective switching transistors T1 to T9. More particularly, the first switching transistors T1, T4, T7 of each block are connected to a common line 102, the second switching transistors T2, T5, T8 of each block are connected to a common line 103, and the third switching transistors T3, T6, T9 of each block are connected to a common line 104. The common lines 102 to 104 are connected to an amplifier 105 via respective switching transistors T10 to T12.

The gate electrodes of switching transistors ST1 to ST9 are connected in common for each block, like the gate electrodes of the switching transistors T1 to T9, to parallel output terminals of a shift resistor 109 for each block. Accordingly, the switching transistors ST1 to ST9 are sequentially turned on for each block at the shift timing of the shift resistor 109.

Also, in FIG. 14, the common lines 102 to 104 are grounded via capacitors C10 to C12, respectively, and grounded via switching transistors CT1 to CT3, respectively. The capacitance of each capacitor C10 to C12 must be sufficiently larger than that of each capacitor C1 to C9. The gate electrodes of the switching transistors CT1 to CT3 are commonly connected to a terminal 108. That is, if a high level is applied to the terminal 108, the switching transistors CT1 to CT3 are turned on simultaneously, so that the common lines 102 to 104 are grounded. Further, the photoelectric conversion units E1 to E9 of the thin film transistor type have gate electrodes G1 to G9.

Figure 15:
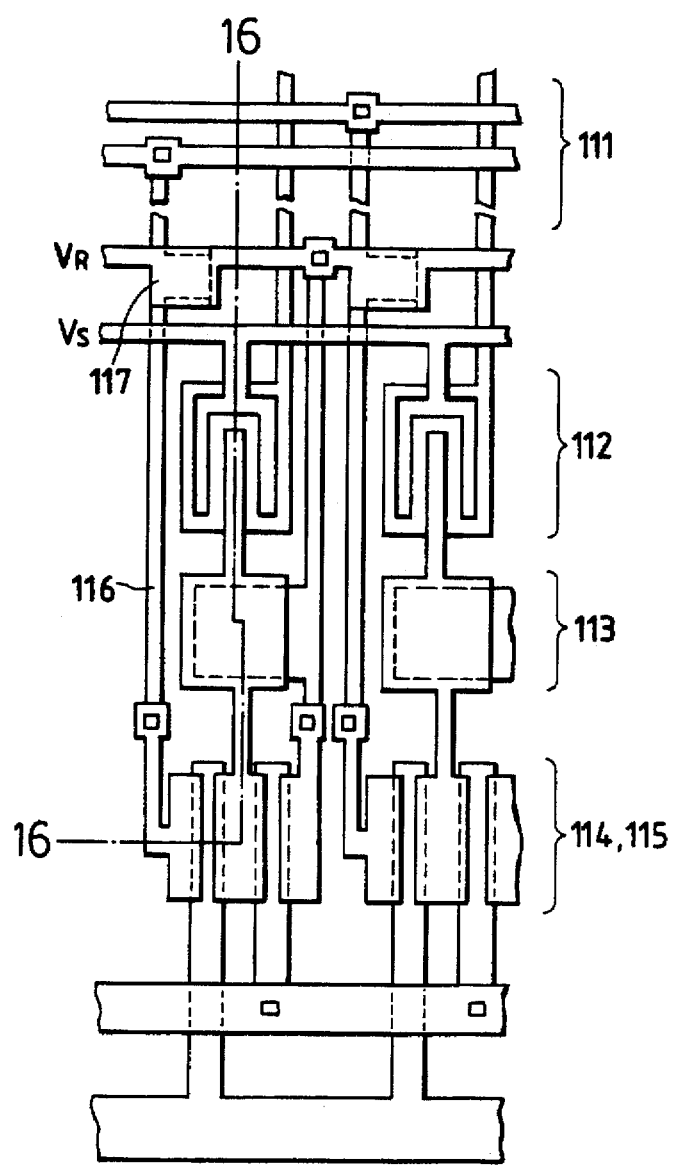
FIG. 15 is a partial plan view of a contact sensor array having the circuit of FIG. 14.

FIG. 15 is a partial plan view of an one-dimensional complete contact sensor array as fabricated based on the circuit diagram as shown in FIG. 14. In the same figure, 111 is a matrix-like wiring portion composed of the common lines 102 to 104, 112 is a photoelectric conversion portion of the thin film transistor type, 113 is an electric charge storage portion composed of the capacitors C1 to C9, 114 is a transfer switch composed of the switching transistors T1 to T9 and using a thin film transistor having the same structure as the photoelectric conversion portion, 115 is a discharge switch composed of the switching transistors ST1 to ST9 and using a thin film transistor having the same structure as the photoelectric conversion portion, 116 is an extension line for connecting a signal output of the transfer switch 114 to a signal processing IC, and 117 is a load condenser composed of the capacitors CT1 to CT3 and for storing and reading a signal electric charge transferred by the transfer switch 114.

Figure 16:
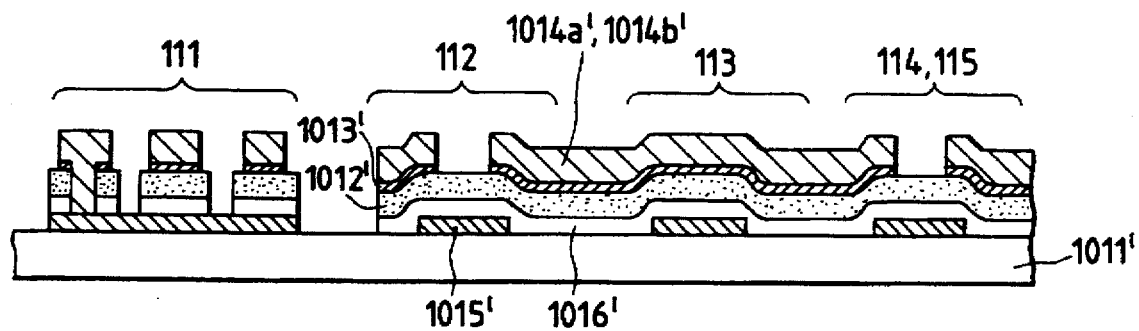
FIG. 16 is a cross-sectional view of the contact sensor array of FIG. 15 taken along A–A'.

FIG. 16 is an A–A' cross-sectional view of FIG. 15. As can be clearly seen from FIG. 16, the photoelectric conversion portion 112 of the thin film transistor type, the electric charge storage portion 113, the transfer switch 114, the discharge switch 115, the matrix-like wiring portion 111, and the load condenser 117 all have a common constitution in which the metal (gate electrode 1015' in the photoelectric conversion portion), the insulating layer (gate insulating layer 1016' in the photoelectric conversion portion), the photoconductive semiconductor layer (1012' in the photoelectric conversion portion), the ohmic contact layers (1013a', 1013b' in the photoelectric conversion portion), and the metals (electrodes 1014a', 1014b' in the photoelectric conversion portion) are formed in this order on the substrate 1011'.

From the examination for various characteristics of the photoelectric conversion portion of the thin film transistor type, like the example 1, the same characteristics as in the example 1 were shown. Also, the thin film transistor in the driving circuit portion indicated sufficient characteristics.

Figure 17:
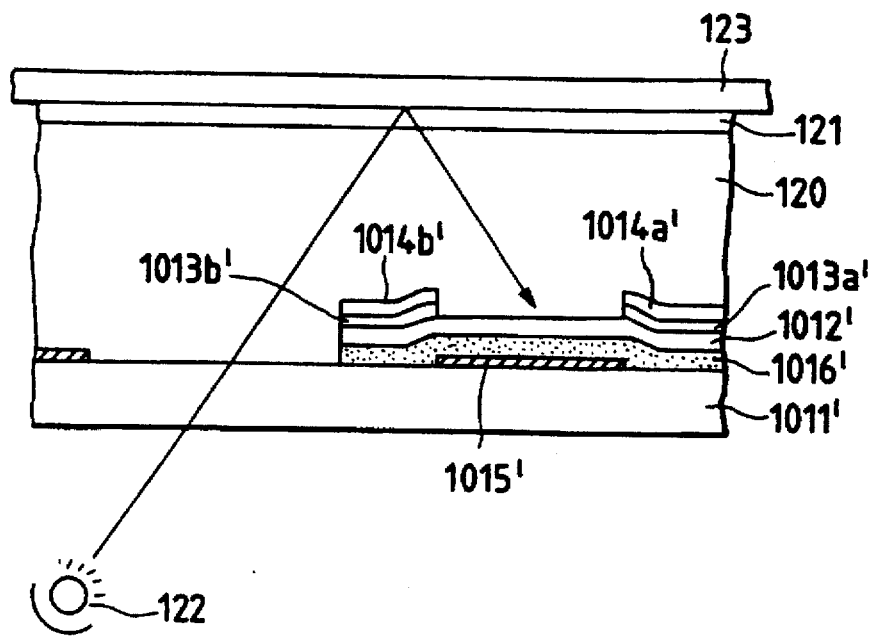
FIG. 17 is a view of packaging the contact photo-sensor array using the photoelectric conversion element of the present invention.

FIG. 17 is a cross-sectional view of a photoelectric conversion element according to the present invention which is packaged as one-dimensional complete contact photosensor array. In FIG. 17, a wear-resisting layer 121 made of a glass is formed via a protective layer 120 on the photoelectric conversion portion and the driving circuit portion, in which an original 123 is read with the irradiation from a light source 122 such as a light emitting diode from a back surface of the transparent substrate 1011 made of a glass. It will be understood that the photo-sensor array sensor using a photoelectric conversion element of the present invention can be used as the one-dimensional contact photo-sensor array.

In the previous examples, the thin film forming material was $SiH_4$ and $H_2$, but is not limited to them, and may contain F, or have a chemical formula of $SiH_{2n+2}$ (n is an integer equal to or greater than 2). The silicon semiconductor referred to in the present invention may contain silicon and others containing fluorine, in addition to at least a material composed of silicon and hydrogen.

(EXAMPLE 3)

The third example of the present invention will be described with reference to FIGS. 18 and 19.

Figure 19:
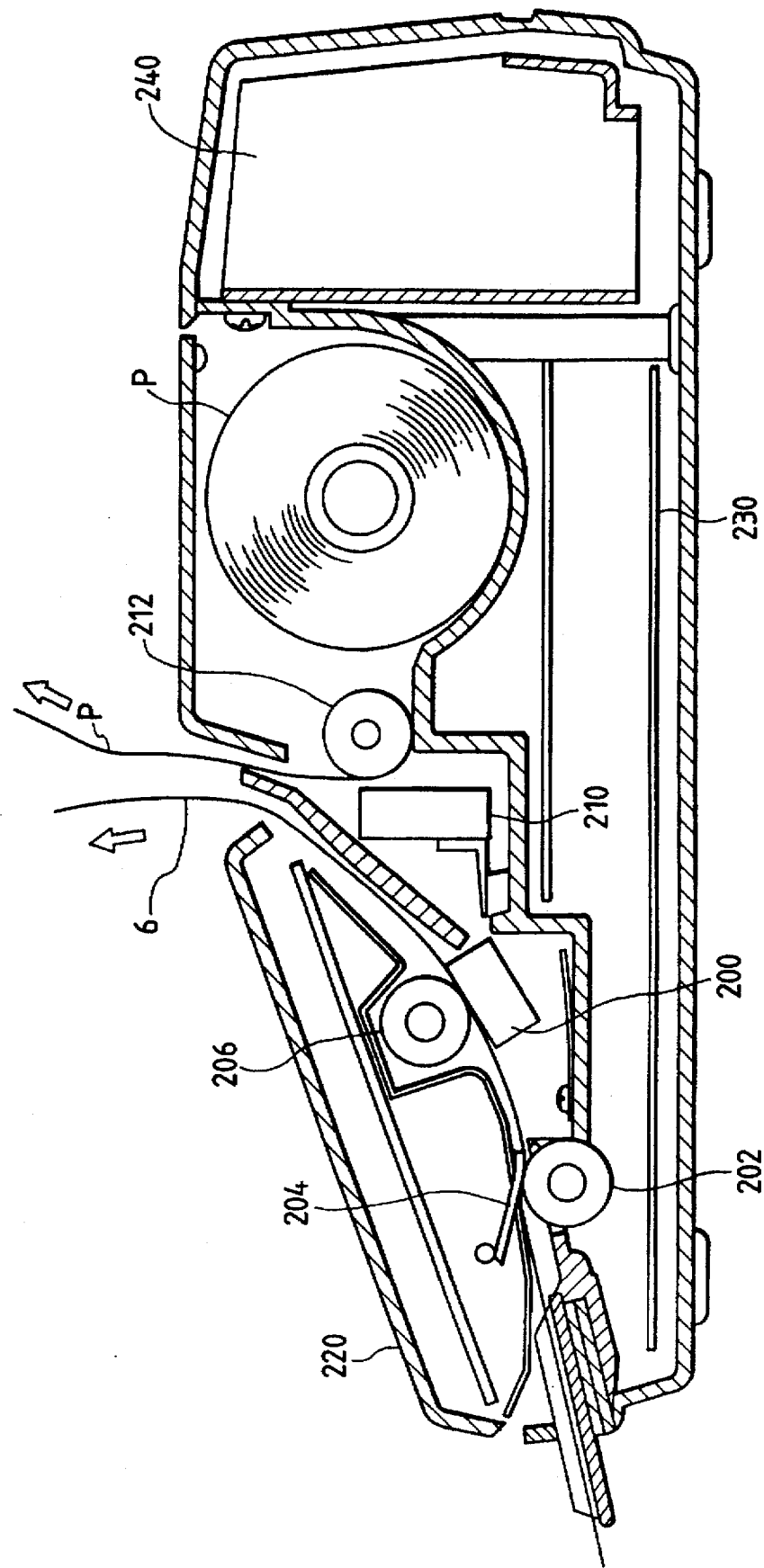
FIG. 19 is a schematic constitutional view showing an example of a facsimile terminal equipment having the communication facility as an image information processing apparatus using a sensor unit according to the present invention.

Note that since the constitution of the photoelectric conversion unit which is a basic structure of the photoelectric conversion element in this example is the same as that of the photoelectric conversion element as shown in FIG. 19, the explanation will be given in connection with FIG. 19.

Figure 18:
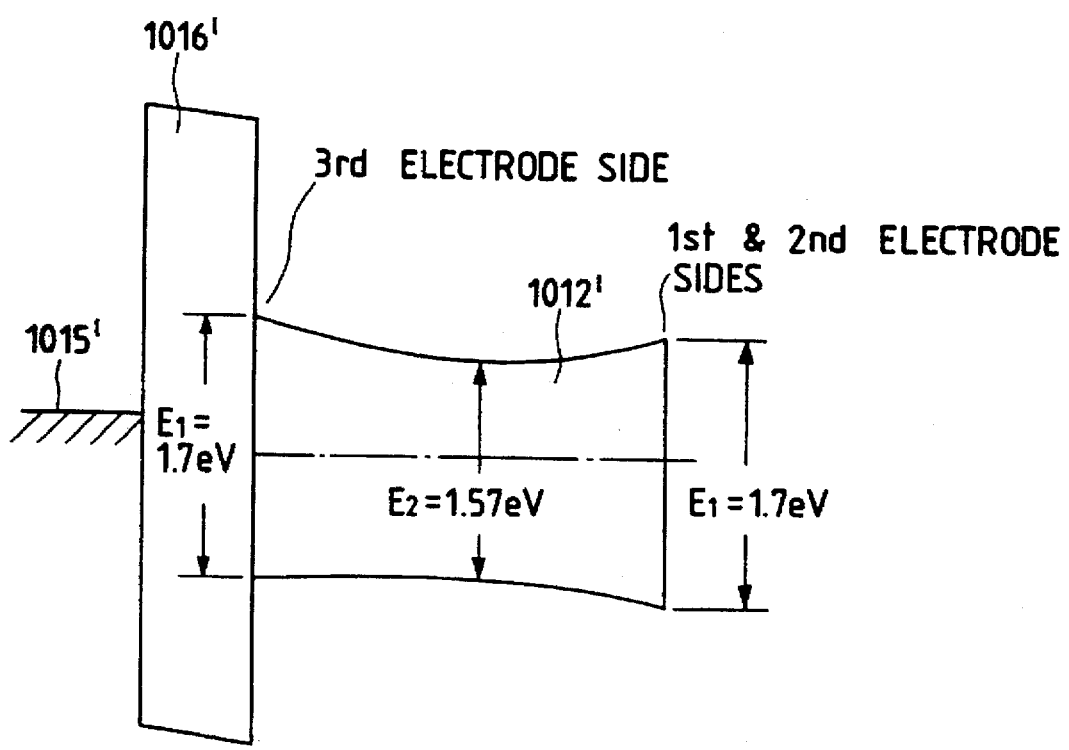

FIG. 18 is an energy band diagram of a photoconductive semiconductor layer for the photoelectric conversion element in this example.

The photoconductive semiconductor layer 1012' is such that the energy band gap width (optical band gap) $E_1$ is wider on the sides of the insulating layer 1016', the first electrode 1014a', the second electrode 1014b', and the band gap width (optical band gap) $E_2$ is narrower within a layer of the photocondcutive semiconductor layer 1012'. Note that $E_1 = 1.7$ eV and $E_2 = 1.57$ eV.

Next, the fabrication method of the photoelectric conversion element in this example will be described with reference to FIG. 19.

(1) A Cr layer having a film thickness of 0.1 μm was deposited on a glass substrate 1011' (#7059 manufactured by Corning) with the sputtering method to form a third electrode 1015', and patterned with a predetermined pattern.

(2) This substrate 1011' was set on a plasma CVD apparatus, with the temperature set at 350° C., and then $SiH_4$ gas, $NH_3$ gas, $H_2$ gas were introduced at a predetermined mixture ratio, to deposit an insulating layer 1016' of $SiN_x$:H with a film thickness of 3000 Å.

(3) Next, the substrate 1011 was set on the plasma CVD apparatus as shown in FIG. 13, and the photoconductive semiconductor layer 1012' was deposited in the following procedure. Note that the forming materials of the photoconductive semiconductor layer 1012' were $SiH_4$ gas and $H_2$ gas.

First, in the plasma CVD apparatus as above described, the chamber 70 was exhausted to a predetermined pressure with an exhaust pump 74, while the substrate 1011' was heated up to 340° C. with a heater not shown.

In this example, the film thickness of the photoconductive semiconductor layer was 6000 Å, and in depositing the photoconductive semiconductor layer, at an early stage of the deposition for the photoconductive semiconductor layer on the side of the insulating layer 1016', the $t_2$ time was hardly given to deposit the non-single crystal silicone without the supply of atomic hydrogen, and then, the $t_2$ time was increased consecutively up to a deposition time for which the deposited film thickness of the photoconductive semiconductor layer was roughly half (about 3000 Å), whereby the band gap width (optical band gap) was changed from 1.7 eV to 1.57 eV.

In remaining deposition time, the $t_2$ time was conversely decreased consecutively, and was controlled to be substantially zero at a set film thickness (6000 Å) of the photoconductive semiconductor layer on the side of the first electrode 1014a' and the second electrode 1014b', whereby the band gap width (optical band gap) was changed from 1.57 eV to 1.7 eV.

(4) This substrate was set on the normal plasma CVD apparatus, and after predetermined amounts of $SiH_4$ gas, $PH_3$ gas and $H_2$ gas were introduced into a reaction chamber, an ohmic contact layer having a film thickness of 1500 Å was formed.

(5) Finally, 8000 Å Al was formed with the sputtering method, and the ohmic contact layer as above described and the Al layer were patterned, so as to form the first electrode 1014a', and the second electrode 1014b'.

For the photoelectric conversion element of the thin film transistor type thus formed, the measurement of the photo current was made. As a result, with the voltage $V_g$ of the third electrode 1015' being about −2V, the photo current value could be made equivalent to a voltage $V_g = 0V$ for the a—Si:H single layer.

In the example 3, the atomic hydrogen was produced by the microwave and supplied to a RF plasma, but the atomic hydrogen due to the hydrogen plasma in RF may be used. Also, $H_2$ gas was used, but $D_2$ gas may be also used. Moreover, $SiH_4$ gas was used in this example, but the gas as represented by $Si_nH_{2(n+1)}$ may be used. Also, F may be contained.

(EXAMPLE 4)

The fabrication method of a photoelectric conversion element in the fourth example will be described below.

(1) A Cr layer having a film thickness of 0.1 μm was deposited on a glass substrate 1011' (#7059 manufactured by Corning) with the sputtering method to form a third electrode 1015', and patterned with a predetermined pattern.

(2) This substrate 1011' was set on a plasma CVD apparatus, with the substrate temperature set at 350° C., and then $SiH_4$ gas, $NH_3$ gas, $H_2$ gas were introduced at a predetermined mixture ratio, to deposit an insulating layer 1016' of $SiN_x$:H with a film thickness of 3000 Å.

(3) Next, $SiH_4$ gas and $H_2$ gas were introduced into a reaction chamber at a predetermined mixture ratio, and a—Si:H for the photoconductive semiconductor layer 1012' was deposited. Then the ratio of $SiH_4/(SiH_4+GeH_4)$ was decreased by adding $GeH_4$ gas up to a time for which the film thickness was roughly half (about 3000 Å) the deposited film thickness of the photoconductive semiconductor layer, thereby to form a—SiGex:H. The band gap width was changed from about 1.7 eV to 1.4 eV by modulating the composition of a—Si:H with Ge having a narrower forbidden width.

In remaining deposition time, by conversely increasing the ratio of $SiH_4/(SiH_4+GeH_4)$, the photoconductive semiconductor layer on the side of the first electrode 1014a' and the second electrode 1014b' was controlled to be deposited only with $SiH_4$ gas and $H_2$ gas. In this way, the photoconductive semiconductor layer of which the band gap width on the side of the first electrode 1014a and the second electrode 1014b was about 1.7 eV could be formed. This photoconductive semiconductor layer 1012' had an energy band gap width of about 1.7 eV on the side of the insulating layer and the first and second electrodes, and was formed such that the band gap width was equal to 1.4 eV at a position about half the film thickness within a layer of the photoconductive semiconductor layer.

(4) Further, after predetermined amounts of $SiH_4$ gas, $PH_3$ gas and $H_2$ gas were introduced into the reaction chamber 70, an 1500 Å thick ohmic contact layer was formed.

(5) Finally, 8000 Å Al was formed with the sputtering method, and the ohmic contact layer as above described and the Al layer were patterned, so as to form the first electrode 1014a', and the second electrode 1014b'.

For the photoelectric conversion element of the thin film transistor type thus formed, the measurement of the photo current was made. As a result, with the voltage $V_g$ of the third electrode 1015' being about −4V, the photo current value could be made equivalent to a voltage $V_g=0V$ for the a—Si:H single layer.

(EXAMPLE 5)

The fifth example of the present invention was constituted in the same way as in example 2 except that the one-dimensional complete contact type sensor array was a driving circuit comprised of a photoelectric conversion element of the thin film transistor type and a thin film transistor as fabricated in the third example.

The fabrication method of each component is the same as in the third example. Also, in this example, like the third example, the examination for various characteristics of the photoelectric conversion element of the thin film transistor indicated the same characteristics as in the third example. It will be understood that the thin film transistor also indicated the sufficient characteristics.

FIG. 17 shows a cross-sectional view of this example with a one-dimentional complete contact photo-sensor array packaged.

It will be understood that the photo-sensor array of the present invention is used as the one-dimensional contact photo-sensor array using an equi-magnification imaging lens.

FIG. 19 is a schematic constitutional view showing an example of a facsimile terminal equipment having the communication facility as an image information processing apparatus as constituted using a sensor unit according to the present invention.

Here, 202 is a feed roller as feeding means for feeding an original 6 to a reading position, and 204 is a separating piece for securely separating the original 6 each one to feed it. 206 is a platen roller as conveying means for conveying the original 6 as well as regulating a read surface of the original 6, which is provided at the reading position for a sensor unit 200.

P is a recording medium in the form of a roll paper in the shown example, onto which the image information read by the sensor unit 200 or the image information transmitted from the external in the facsimile terminal equipment is reproduced. 210 is a recording head as recording means for forming an image, for which various heads such as a thermal head or an ink jet recording head may be used. Also, this recording head may be a serial type or a line type. 212 is a platen roller for regulating the recording surface as well as conveying the recording medium P to the recording position for the recording head 210.

220 is an operation panel as input/output means on which there are disposed a switch for accepting the operation input or a display unit for displaying the message or other statuses of the apparatus.

230 is a system control substrate as control means, on which there are provided a control unit (controller) for controlling each unit, a driving circuit (driver) for the photoelectric conversion element, a processing unit (processor) for the image information, and a transmission/reception unit. 240 is a power source of the apparatus.

Preferable recording means for use in the information processing apparatus of the present invention is that in which its representative constitution and principle is disclosed in, for example, U.S. Pat. Nos. 4,723,129 and 4,740,796. This system is effective because, by applying at least one driving signal which gives rapid temperature elevation exceeding nucleus boiling corresponding to the recording information on electricity-heat conversion arranged corresponding to the sheets or liquid channels holding a liquid (ink), heat energy is generated at the electricity-heat converters to effect film boiling at the heat acting surface of the recording head, and consequently the bubbles within the liquid (ink) can be formed corresponding one by one to the driving signals. By discharging the liquid (ink) through an opening for discharging by growth and shrinkage of the bubble, at least one droplet is formed.

Further, as the recording head of the full line type having a length corresponding to the maximum width of a recording medium which can be recorded by the recording device, either the constitution which satisfies its length by a combination of a plurality of recording heads as disclosed in the above-mentioned specifications or the constitution as one recording head integrally formed may be used.

In addition, the present invention is effective for a recording head of the freely exchangeable chip type which enables electrical connection to the main device or supply of ink from the main device by being mounted on the main device, or a recording head of the cartridge type having an ink tank integrally provided on the recording head itself.

It should be noted that the photoelectric conversion element as described in other examples of the present invention or the photoelectric conversion element as varied without departing from the scope of the present invention is applicable to the above-mentioned information processing apparatus.

As above described, according to the present invention, the band gap width of the photoconductive semiconductor layer is different depending on the side of the insulating layer or the side of the first and second electrodes, so that it is possible to provide a photoelectric conversion element having a larger photo current with a faster light response speed and which is easily fabricated.

What is claimed is:

1. A photoelectric conversion element having a photoelectric conversion section comprising:

an insulating layer having first and second opposed surfaces;

a photoconductive semiconductor layer having first and second opposed surfaces and an intermediate region disposed therebetween, the second surface of said semiconductor layer being adjacent to the first surface of said insulating layer, said semiconductor layer comprising a non-monocrystalline matrix of silicon atoms and containing hydrogen atoms distributed nonuniformly, wherein a concentration of said hydrogen atoms in said semiconductor layer is greater at positions closer to the first and second surfaces of said semiconductor layer than in the intermediate region, so that an energy bandgap width of said semiconductor layer varies between the first and second surfaces of said semiconductor layer;

first and second electrodes electrically connected to the first surface of said semiconductor layer; and a third electrode provided at the second surface of said insulating layer, and opposite to a site between said first and second electrodes.

2. An element according to claim 1, wherein the energy bandgap width of said semiconductor layer is narrower at the first and second surfaces of said semiconductor layer than in the intermediate region.

3. An element according to claim 1, wherein the energy bandgap width of said semiconductor layer is broader at the first and second surfaces of said semiconductor layer than in the intermediate region.

4. A semiconductor element comprising:

a non-monocrystalline semiconductor layer having first and second opposed surfaces and an intermediate region disposed therebetween, comprising silicon atoms as a matrix and containing hydrogen atoms nonuniformly distributed so that a concentration of the hydrogen atoms is greater at positions closer to the first and the second surfaces than in the intermediate region;

first and second electrodes spaced by a gap, and each provided on the first surface of said semiconductor layer through an ohmic contact layer; and a third electrode provided through an insulating layer on the second surface of said semiconductor layer in a position opposite to the gap between said first and second electrodes.

5. A semiconductor element according to claim 4, wherein said semiconductor layer has an energy bandgap which is broader at positions closer to the first and second surfaces of said semiconductor layer than in the intermediate region.

6. A photoelectric conversion element having a photoelectric conversion section comprising:

an insulating layer having first and second opposed surfaces;

a photoconductive semiconductor layer having first and second opposed surfaces and an intermediate region disposed therebetween, the second surface of said semiconductor layer being adjacent to the first surface of said insulating layer;

first and second electrodes spaced by a gap therebetween, and provided on and electrically connected to the first surface of said photoconductive semiconductor layer; and a third electrode provided adjacent to the second surface of said insulating layer, and opposite to the gap, wherein an energy band gap width of said semiconductor layer is varied and is broader at positions closer to the first and second surfaces of said semiconductor layer than in the intermediate region.

7. An element according to claim 6, wherein said semiconductor layer comprises, at the first and second surfaces, a non-monocrystal comprising silicon, germanium and hydrogen.

8. A semiconductor element comprising:

a non-monocrystalline semiconductor layer having first and second surfaces and an intermediate region disposed therebetween, consisting essentially of silicon atoms as a matrix and containing hydrogen atoms, wherein a concentration of said hydrogen atoms changes continuously so that the concentration is greater at positions closer to the first and second surfaces of said semiconductor layer than in the intermediate region;

a third electrode provided on said first surface of said semiconductor layer through an insulating layer; and first and second electrodes each provided through an ohmic contact layer on the side of the second surface of said semiconductor layer.

9. A semiconductor element comprising:

a non-monocrystalline semiconductor layer having first and second surfaces and an intermediate region disposed therebetween, consisting essentially of silicon atoms as a matrix and having a region containing germanium atoms wherein a concentration of said germanium atoms changes continuously in a layer thickness direction so that an energy bandgap of said semiconductor layer is broader at positions closer to the first and second surfaces of said semiconductor layer than in the intermediate region;

first and second electrodes each provided on the first surface of said semiconductor layer through an ohmic contact layer; and a third electrode provided through an insulating layer on the side of the second surface of said semiconductor layer opposite to the first surface of said semiconductor layer.

10. A semiconductor element according to claim 9, wherein said germanium atoms are contained in an inner section of said semiconductor layer.

11. A semiconductor element according to claim 9, wherein said third electrode is provided on a side of said semiconductor layer opposite to said first and second electrodes.

* * * * *

UNITED STATES PATENT AND TRADEMARK OFFICE
CERTIFICATE OF CORRECTION

PATENT NO. : 5,680,229
DATED : October 21, 1997
INVENTOR(S) : MASATO YAMANOBE, ET AL.     Page 1 of 2

It is certified that error appears in the above-identified patent and that said Letters Patent is hereby corrected as shown below:

COLUMN 3

Line 15, "recobmination" should read --recombination--.

COLUMN 4

Line 2, "ventration" should read --centration--.

COLUMN 5

Line 11, "in" should read --is--.

COLUMN 7

Line 13, "electrode 1014b." should read
　　　　--electrode 1014b'.--.

COLUMN 8

Line 13, "an" should read --a--.

COLUMN 9

Line 36, "substrate 1011" should read --substrate 1011'--.

UNITED STATES PATENT AND TRADEMARK OFFICE
CERTIFICATE OF CORRECTION

PATENT NO. : 5,680,229
DATED : October 21, 1997
INVENTOR(S) : MASATO YAMANOBE, ET AL.

Page 2 of 2

It is certified that error appears in the above-identified patent and that said Letters Patent is hereby corrected as shown below:

COLUMN 10

Line 52, "electrode 1014a" should read --electrode 1014a'--;
Line 53, "1014b" should read --1014b'--; and
Line 62, "an" should read --a--.

COLUMN 12

Line 3, "nucleus" should read --nucleate--.

Signed and Sealed this

Fifteenth Day of September, 1998

Attest:

BRUCE LEHMAN

*Attesting Officer*    Commissioner of Patents and Trademarks